(12) United States Patent
Zhu et al.

(10) Patent No.: US 9,178,070 B2
(45) Date of Patent: Nov. 3, 2015

(54) SEMICONDUCTOR STRUCTURE AND METHOD FOR MANUFACTURING THE SAME

(75) Inventors: Huilong Zhu, Poughkeepsie, NY (US); Qingqing Liang, Beijing (CN); Zhijiong Luo, Poughkeepsie, NY (US); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 449 days.

(21) Appl. No.: 13/138,053

(22) PCT Filed: Mar. 4, 2011

(86) PCT No.: PCT/CN2011/071514
§ 371 (c)(1),
(2), (4) Date: Jun. 27, 2011

(87) PCT Pub. No.: WO2012/071823
PCT Pub. Date: Jun. 7, 2012

(65) Prior Publication Data
US 2012/0132990 A1    May 31, 2012

(30) Foreign Application Priority Data
Nov. 30, 2010   (CN) .......................... 2010 1 0574357

(51) Int. Cl.
*H01L 27/12*   (2006.01)
*H01L 29/786*   (2006.01)
*H01L 29/423*   (2006.01)
*H01L 29/66*   (2006.01)

(52) U.S. Cl.
CPC .... *H01L 29/78648* (2013.01); *H01L 29/42384* (2013.01); *H01L 29/66772* (2013.01); *H01L 29/78603* (2013.01)

(58) Field of Classification Search
CPC ................... H01L 29/78603; H01L 29/78645; H01L 29/42384; H01L 29/78648
USPC .................. 257/347, E27.112, 365, E29.275; 438/151, 157, 176, 283
See application file for complete search history.

(56) References Cited

U.S. PATENT DOCUMENTS 5,619,054 A * 4/1997 Hashimoto .................... 257/347
5,942,781 A * 8/1999 Burr et al. ..................... 257/347

(Continued)

FOREIGN PATENT DOCUMENTS

| CN | 1252833 C | 4/2006 |
| CN | 1830090 A | 9/2006 |
| CN | 1901228 A | 1/2007 |

OTHER PUBLICATIONS

International Search Report and Written Opinion of the Chinese Patent Cooperation Treaty Office in counterpart Application No. PCT/CN2011/071514, dated Nov. 30, 2010.

*Primary Examiner* — Kenneth Parker
*Assistant Examiner* — John Lin
(74) *Attorney, Agent, or Firm* — Kinney & Lange, P.A.

(57) ABSTRACT

The present application discloses a semiconductor structure and a method for manufacturing the same. A semiconductor structure according to the present invention can adjust the threshold voltage by capacitive coupling between a backgate region either and a source region or a drain region with a common contact, i.e. a source contact or a drain contact, which leads to a simple manufacturing process, a higher integration level, and a lower manufacture cost. Moreover, the asymmetric design of the backgate structure, together with the doping of the backgate region which can be varied as required in an actual device design, can further enhance the effects of adjusting the threshold voltage and improve the performances of the device.

12 Claims, 6 Drawing Sheets

(56) References Cited

U.S. PATENT DOCUMENTS

| | | |
|---|---|---|
| 6,383,904 B1 | 5/2002 | Yu |
| 6,391,695 B1 | 5/2002 | Yu |
| 8,030,145 B2 * | 10/2011 | Chang et al. .................. 438/157 |
| 2009/0212362 A1 * | 8/2009 | Cheng et al. .................. 257/347 |

* cited by examiner

SEMICONDUCTOR STRUCTURE AND METHOD FOR MANUFACTURING THE SAME

CROSS REFERENCE TO RELATED APPLICATION(S)

This application is the national stage of PCT Application No. PCT/CN2011/071514 filed on Mar. 4, 2011, which claim priority to Chinese Application No. 201010574357.2 filed on Nov. 30, 2010. The entire contents of these applications are incorporated herein by reference in their entirety.

FIELD OF INVENTION

The present invention relates to semiconductor technology, and more particularly, to a semiconductor-on-insulator (SOI) metal oxide semiconductor field effect transistor (MOSFET) structure and a method for manufacturing the same.

DESCRIPTION OF RELATED ART

A complementary metal oxide semiconductor transistor has a smaller and smaller gate pitch for achieving an improved efficiency and a lowered manufacture cost in very large scale integration. However, a smaller gate pitch causes short channel effects, which deteriorates performances of the device.

SOI technology means that devices and circuits are formed in a silicon film on an Is insulating layer. Due to the existence of a buried oxide layer, the devices are completely isolated from each other. Thus, the SOI-CMOS integration avoids in its nature the latch up effect in body silicon CMOS. Moreover, a fully depleted SOI (FD-SOI) device has relatively smaller short channel effects, forms naturally a shallow junction, and has a relatively smaller leakage. Thus, the fully depleted SOI MOSFET having an ultra-thin body and a double-gate attracts a great deal of attention. In order to adjust the threshold voltage and suppress short channel effects, a grounded SOI layer is formed below the ultra-thin buried oxide layer in an SOI MOSFET. However, conventional processes require additional contacts and wirings, which cause an increased footprint of the device.

In view of the above, there is a need for a novel semiconductor structure and a novel method for manufacturing the semiconductor structure which can adjust the threshold voltage and reduce the device size.

SUMMARY OF THE INVENTION

One object of the present invention is to provide a semiconductor structure and a method for manufacturing the same for solving the above problems in the prior art.

According to one aspect of the invention, there is provided a semiconductor structure, comprising:

an SOI substrate, comprising an SOI layer, a first buried insulating layer, an additional SOI layer, a second buried insulating layer and a base substrate, in this order from top to bottom;

a shallow trench isolation embedded in the SOI substrate and on the second buried insulation layer;

a gate on the SOI substrate;

a source region and a drain region on opposite sides of the gate;

a backgate region which is formed from the additional SOI layer by doping a portion of the additional SOI layer, comprising at least a portion of the additional SOI layer below either the source region or the drain region and a portion of the additional SOI layer below the gate; and a source contact and a drain contact.

In one embodiment of the present invention, the first buried insulating layer, and the second buried insulating layer are preferably buried oxide layers.

Preferably, a portion of the additional SOI layer below the other one of the source region and the drain region is an isolating dielectric region, which is adjacent to the backgate region.

Preferably, the semiconductor structure comprises a raised source region and a raised drain region, which are on the source region and the drain region, respectively.

According to another aspect of the invention, there provides a method for manufacturing a semiconductor structure, comprising:

providing an SOI substrate, comprising an SOI layer, a first buried insulating layer, an additional SOI layer, a second buried insulating layer and a base substrate, in this order from top to bottom;

forming a shallow trench isolation embedded in the SOI substrate and above the second buried insulation layer;

forming a backgate region by doping a portion of the additional SOI layer;

forming a gate on the SOI substrate, and forming a source region and a drain region on opposite sides of the gate;

the backgate region comprises at least a portion of the additional SOI layer below either the source region or the drain region and a portion of the additional SOI layer below the gate; and forming a source contact and a drain contact.

In one embodiment of the present invention, the first buried insulating layer, and the second buried insulating layer are preferably buried oxide layers.

Preferably, the step of doping a portion of the additional SOI layer comprises performing n-type or p-type doping with a doping concentration of $10^{18}$~$10^{21}$ cm$^{-3}$.

Preferably, an isolating dielectric region is formed in a portion of the additional SOI layer below the other one of the source region and the drain region, and the isolating dielectric region is adjacent to the backgate region.

Preferably, the step of forming the isolating dielectric region comprises:

performing n-type heavy doping in a portion of the additional SOI layer before formation of the shallow trench isolation;

forming a shallow trench isolation, so as to expose one side of the n-type heavily doped region;

removing the n-type heavily doped region; and depositing an isolating dielectric.

Preferably, the step of performing n-type heavy doping comprises performing As or P ion implantation.

Preferably, the doping concentration is large than $10^{18}$ cm$^{-3}$.

Preferably, a raised source region and a raised drain region are formed on the source region and the drain region, respectively.

In the above semiconductor structure, with a common contact, the threshold voltage is adjusted by capacitive coupling between the backgate region and the source region or drain region, which leads to a simple manufacturing process, a higher integration level, and a lower manufacture cost. Moreover, the asymmetric design of backgate structure can further enhance the effects of adjusting the threshold voltage and improve the device performances. Meanwhile, the doping in the backgate region can be varied as needed in an actual device design to further improve the effects of adjusting the threshold voltage.

DETAILED DESCRIPTION OF PREFERRED EMBODIMENTS

Figure 1:
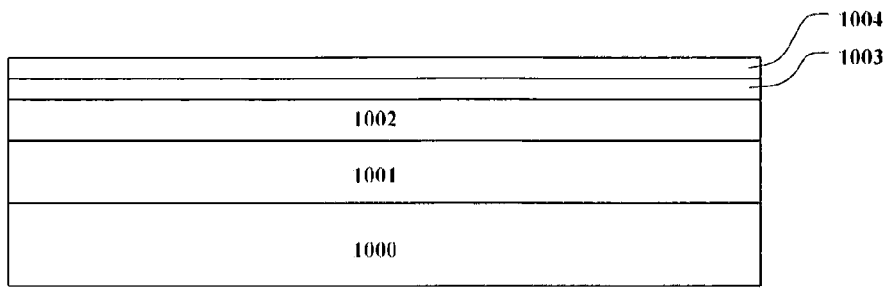
FIG. 1 is a cross sectional view illustrating an SOI substrate in an embodiment of the method for manufacturing the semiconductor structure according to the present invention.

The present invention will be described below with those preferred embodiments in connection with attached drawings. The same reference numerals are used throughout the Figures to indicate the same or similar part or the part having the same or similar functions. The embodiments in connection with the attached drawings are only illustrative for explaining the present invention, but are not construed as limiting the invention.

The disclosure below provides various embodiments or examples for carrying out the technical solution of the present invention. Although the parts and arrangements of some specific examples are described, the parts and arrangements are only given as examples, but are not construed as limiting the present invention.

Moreover, the invention provides various specific processes and/or materials. Nevertheless, one skilled person in the art will appreciate that other processes and/or materials can also be used as alternatives, without departing from the protection scope of the invention. Note that the relations of various structures described herein include necessary extensions introduced by the process.

FIGS. 1-10 illustrate various steps in an embodiment of the method for manufacturing the semiconductor structure according to the present invention. The various steps in an embodiment of the method for manufacturing the semiconductor structure according to the present invention, and the resultant semiconductor structure will be described below in detail in connection with the attached drawings.

Firstly, a silicon-on-insulator (SOI) substrate is provided, which comprises an SOI layer 1004, a first buried oxide layer 1003, an additional SOI layer (for example, a polysilicon layer) 1002, a second buried oxide layer 1001, and a base substrate 1000, as shown in FIG. 1. The SOI layer can be made of, but not limited to, one of Si, SiGe, SiC, and SiGeC, or any combinations thereof. The second buried oxide layer 1001 can also be other buried insulating layer.

The SOI substrate can be manufactured with a conventional oxygen ion implantation and separation (SIMOX) process, such as thermal bonding and cutting, which is well known by one skilled person in the art. Thickness of the various layers of an SOI wafer can be varied by a manufacture process. Typically, the SOI layer 1004 has a thickness of about 5-30 nm, the first buried oxide layer 1003 has a thickness of about 2-25 nm, the additional SOI layer 1002 has a thickness of about 10-50 nm, and the second buried oxide layer 1001 has a thickness of about 60-200 nm. The above thicknesses are only illustrative, but are not construed as limiting the present invention. The first buried oxide layer 1003 can also be other buried insulating layer.

Figure 2:
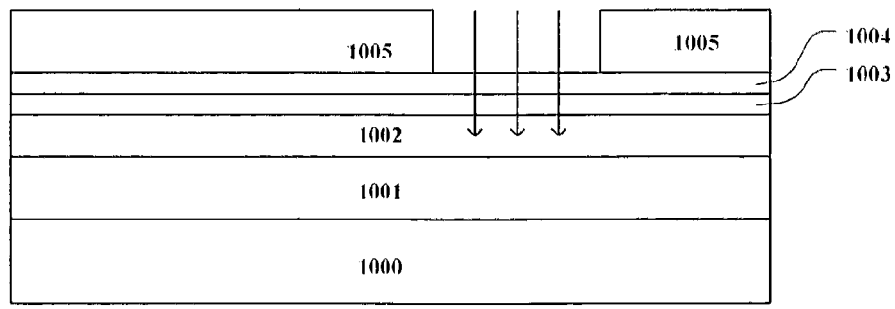
FIG. 2 is a cross sectional view illustrating that an additional SOI layer is n-type heavily doped with photoresist as a mask in an embodiment of the method for manufacturing the semiconductor structure according to the present invention.
Figure 3:
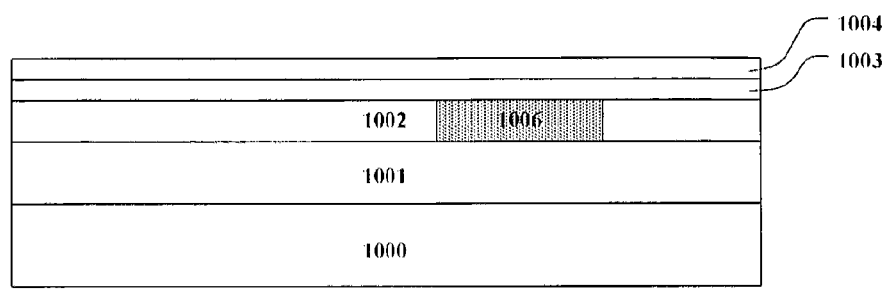
FIG. 3 is a cross sectional view illustrating that the photoresist is removed and anneal is performed for activating implanted ions in an embodiment of the method for manufacturing the semiconductor structure according to the present invention.

A backgate region is then formed. In one embodiment of the present invention, photoresist 1005 is firstly formed on the SOI substrate by spin coating, and then patterned to expose a portion of the surface of the SOI substrate. The exposed region of the additional SOI layer is then n-type heavily doped with the photoresist 1005 as a mask, as shown in FIG. 2. In an embodiment of the present invention, n-type dopants such as As or P are used in ion implantation. The dose of dopants is typically higher than $10^{18}$ cm$^{-3}$. The photoresist is then removed by a conventional process. Anneal is performed to activate implanted ions, so as to form an n-type heavily doped region 1006, as shown in FIG. 3. Preferably, the annealing temperature is in the range of 800° C. to 1000° C.

Figure 4:
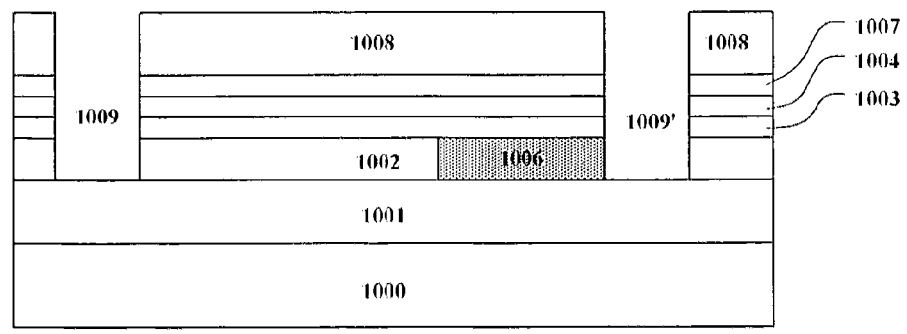
FIG. 4 is a cross sectional view illustrating that a shallow trench isolation is formed by a conventional process in an embodiment of the method for manufacturing the semiconductor structure according to the present invention.

Trenches 1009, 1009' for shallow trench isolation (STI) are then formed, which results in a semiconductor structure shown in FIG. 4. For example, a pad oxide layer is formed on the substrate. It can be formed by a conventional process such as APCVD, LPCVD, PECVD, or by thermal oxidation. Process parameters such as flow rate of raw materials, temperature, pressure and the like can be controlled so as to form a pad oxide layer 1007 having a predetermined thickness and a good quality. The pad oxide layer 1007 in an embodiment has a thickness of 5-10 nm. A nitride layer 1008 is formed on the pad oxide layer by a conventional deposition process. The nitride layer 1008 has a thickness of 50-120 nm. The pad oxide layer 1007 is used for protecting the underlying substrate structure during etching or other processes. The nitride layer 1008 is used as a mask layer during the subsequent etching for forming STI. STI is then formed by patterning.

Photoresist is provided on the nitride layer 1008 by spin coating, and then is exposed and developed to form a pattern therein. Shallow trenches are formed by etching, for example, by an anisotropic dry etching process. In one embodiment, preferably, the portions of the pad oxide layer 1007 and the nitride layer 1008 at the STI region are to etched away completely by reactive ion etching. The etching is continued to etch the SOI substrate until it stops on the second oxide layer 1001, so as to form isolation trenches. The isolation trenches 1009, 1009' expose a top surface of the second buried oxide layer 1001 at the STI regions and a side surface of the n-type heavily doped region 1006 of the additional SOI layer 1004. The photoresist is then Is removed by a conventional process which is known in the art.

Figure 5:
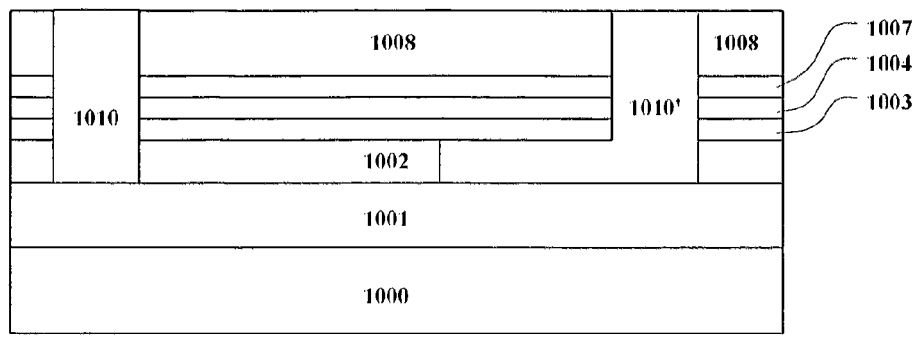
FIG. 5 is a cross sectional view illustrating that the n-type heavily doped additional SOI layer is selective etched and filled with isolating dielectric in an embodiment of the method for manufacturing the semiconductor structure according to the present invention.

The n-type heavily doped region of the additional SOI layer is then removed completely by etching selective to the undoped or p-type doped silicon, so as to form an asymmetric shallow trench for the STI. The trenches are then filled with an isolating dielectric, so as to form shallow trench isolations 1010, 1010'.The isolating dielectric can be one of nitrides, nitrides or any combinations thereof. An oxide is used in one embodiment. The STI is then planarized, for example, by removing portions of the oxide layer by chemical mechanical polishing (CMP) which stops on the nitride layer 1008. The resultant semiconductor structure is shown in FIG. 5. The oxide layer is etched back and the nitride layer 1008 is removed completely.

Figure 6:
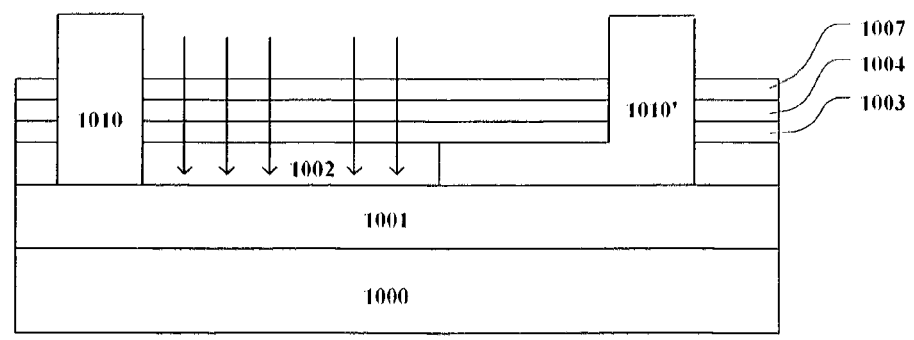
FIG. 6 is a cross sectional view illustrating that a backgate region is formed in an embodiment of the method for manufacturing the semiconductor structure according to the present invention.

A backgate region is then formed. The electrical resistance of the additional SOI layer is then reduced, so as to form a backgate region 1001 adjacent to the isolating dielectric region in the additional SOI layer. The resultant semiconductor structure is shown in FIG. 6. An ion implantation process is used in one embodiment of the present invention. The semiconductor structure undergoes n-type doping with ions such as As, P, and the like, or p-type doping with ions such as In, B, and the like, as required by an actual device design. The doping concentration is typically in the range of $10^{18}$~$10^{21}$ $cm^{-3}$. For example, an nMOSFET is preferably n-type doped for an increased threshold voltage.

Figure 7:
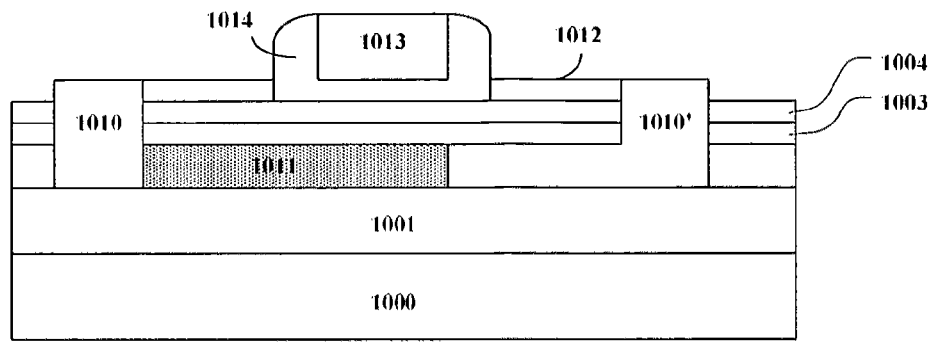
FIG. 7 is a cross sectional view illustrating that a MOSFET structure is formed in an embodiment of the method for manufacturing the semiconductor structure according to the present invention.

The pad oxide layer 1007 is then etched away completely, and a MOSFET is formed by conventional processes. The resultant semiconductor structure is shown in FIG. 7. For example, a gate 1013 is formed. Specifically, a gate dielectric layer is deposited, the material of which is at least one selected from the group consisting of $HfO_2$, HfSiO, HfSiON, HfTaO, HfTiO, HfZrO, $Al_2O_3$, $La_2O_3$, $ZrO_2$, and LaAlO. A gate conductor layer is then deposited, the material of which is, for example, metal or polysilicon. The gate is patterned. Photoresist is formed on the gate conductor layer by spin coating and baking at a predetermined temperature. The photoresist is then exposed and developed, so as to form a mask pattern as required by the gate on the oxide layer. The gate conductor layer and the gate dielectric layer are etched. The photoresist is removed by a conventional process. The gate dielectric layer has a thickness of 1-3 nm, for example, 2 nm, and the gate conductor layer has a thickness of 50-100 nm, for example, 60 nm, 70 nm, 80 nm, or 90 nm.

An isolating dielectric layer 1014 is then formed on the sidewalls of the gate, the material of which is at least one of oxides, nitrides, and any combinations thereof. An optional process includes depositing an insulating material and then etching it to form sidewall spacers of the gate.

After forming the sidewall spacers of the gate, source/drain regions are formed in the silicon layer adjacent to the sidewall spacers by a conventional ion implantation and anneal process. Preferably, the source/drain regions are formed in a self-alignment manner. The source region (or the drain region) and the gate are located above the backgate region, the drain region (or the source region) is located above the isolating dielectric region.

Preferably, source/drain extensions and halos are also formed. Specifically, the source/drain halos and extensions can be formed by ion implantation, so as to suppress short channel effects. In the ion implantation, dopants such as As or P are used for forming source/drain extensions for an nMOSFET, and dopants such as B, BF2, or In are used for forming source/drain extensions for a pMOSFET. The dopants such as B, BF2, or In are used for forming source/drain halos for an nMOSFET, and the dopants such as As or P are used for forming source/drain halos for a pMOSFET, followed by spike anneal at the temperature of 900-1100° C., so as to activate the dopants in the source/drain regions.

Preferably, raised source/drain regions 1012 are also formed. Specifically, a layer of epitaxially grown polysilicon or silicon is formed on the source/drain regions, to followed by ion implantation and anneal for doping the layer.

Figure 8:
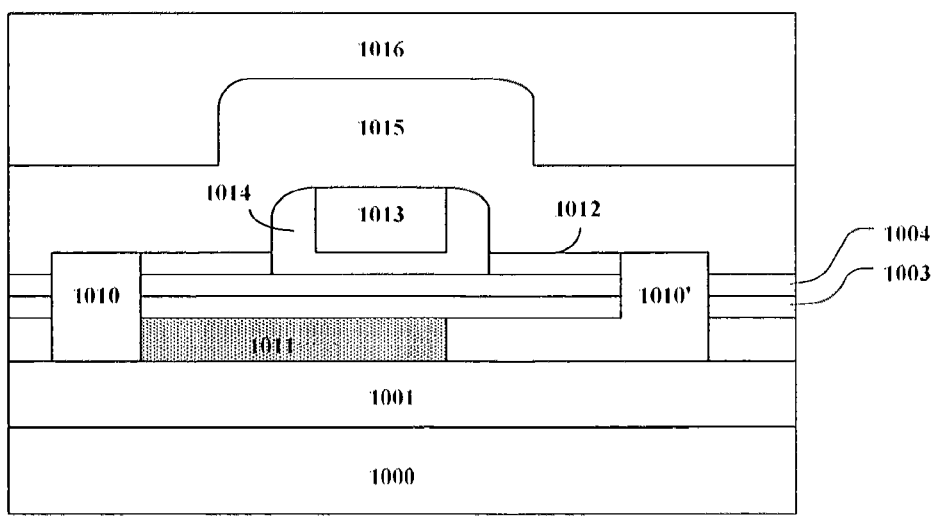
FIG. 8 is a cross sectional view illustrating that a nitride and an oxide are deposited and the surface is then planarized in an embodiment of the method for manufacturing the semiconductor structure according to the present invention.
Figure 9:
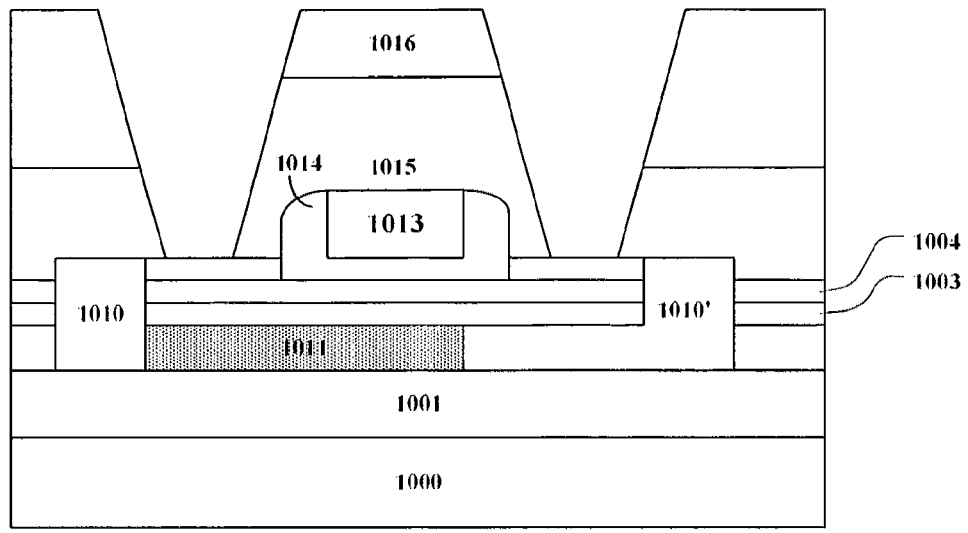
FIG. 9 is a cross sectional view illustrating that contact holes are formed in an embodiment of the method for manufacturing the semiconductor structure according to the present invention.
Figure 10:
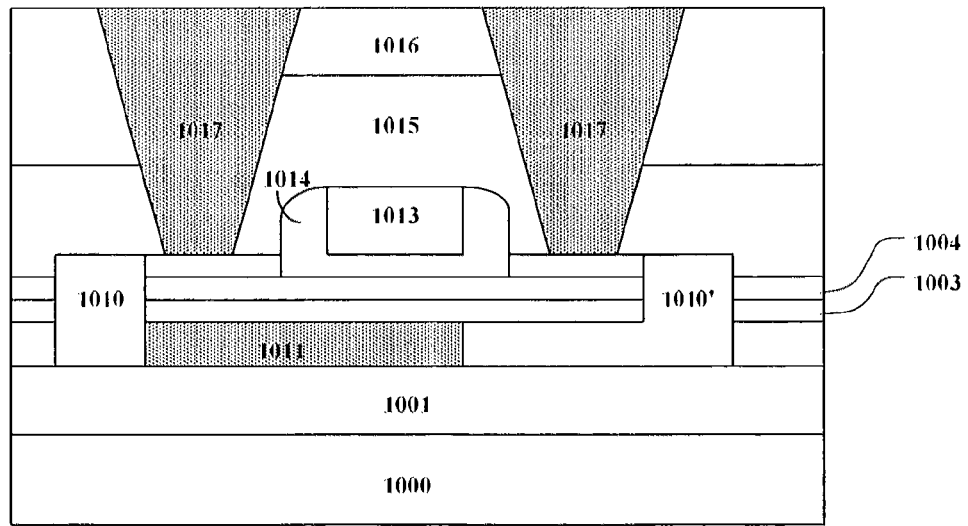
FIG. 10 is a cross sectional view illustrating that contact vias are formed in an embodiment of the method for manufacturing the semiconductor structure according to the present invention.

Then, a process for forming contacts is performed as shown in FIGS. 8-10, which comprises the following steps.

Firstly, the upper portions of the raised source/drains and the gate are converted into silicides by a conventional silicidation process. An insulating layer is deposited and the insulating layer is planarized, so as to form an insulating layer, as shown in FIG. 8. For example, a nitride layer 1015 having a thickness of 30~100 nm is deposited, and an oxide layer 1016 having a thickness of 50~300 nm is deposited on the nitride layer 1015, and these layers are planarized by CMP.

Then, contacts are formed. Firstly, contact holes are formed by a conventional process including lithography and reactive ion etching, as shown in FIG. 9. Specifically, the contact holes extend to the source/drain regions and expose the silicides. The contact holes are then filled with a conductive material so as to form contacts 1017. The conductive material is but not limited to Cu, Al, W, polysilicon and similar conductive materials. Preferably, contact liner is formed with Ti, TiN or their combination, which has a thickness of 1~10 nm. Thus, an SOI MOSFET, which has an asymmetric backgate region 1011 and a common contact for adjusting a threshold voltage by using source or drain regions, is formed, as shown in FIG. 10. The SOI MOSFET has an increased integration level and a lowered manufacture cost, while an effect of adjusting the threshold voltage is further improved and the properties of the device is improved.

Thus, a semiconductor structure according to one embodiment of the present invention is formed, which comprises an SOI substrate, comprising an SOI layer 1004, a first buried insulating layer 1003, an additional SOI layer 1002, a second buried insulating layer 1001, and a base substrate 1000, from top to bottom; a shallow trench isolation embedded in the SOI substrate and on the second buried insulation layer 1001; a gate 1013 on the SOI substrate; source/drain regions on opposite sides of the gate 1013; a backgate region 1011 which is formed from the additional SOI layer 1002 by reducing its electrical resistance, comprising at least a portion of the additional SOI layer 1002 below either the source or drain region and a portion of the additional SOI layer 1002 below the gate; an isolating dielectric region comprising a portion of the additional SOI layer below the other one of the source and drain regions and being adjacent to the backgate region; and source/drain contacts 1007. The second buried oxide layer 1001 and the first buried oxide layer 1003 each may be other kinds of buried insulating layers.

Preferably, a semiconductor structure according to the present invention comprises raised source/drain regions on the source/drain regions.

Preferably, source/drain extensions and halos are also formed.

Figure 11:
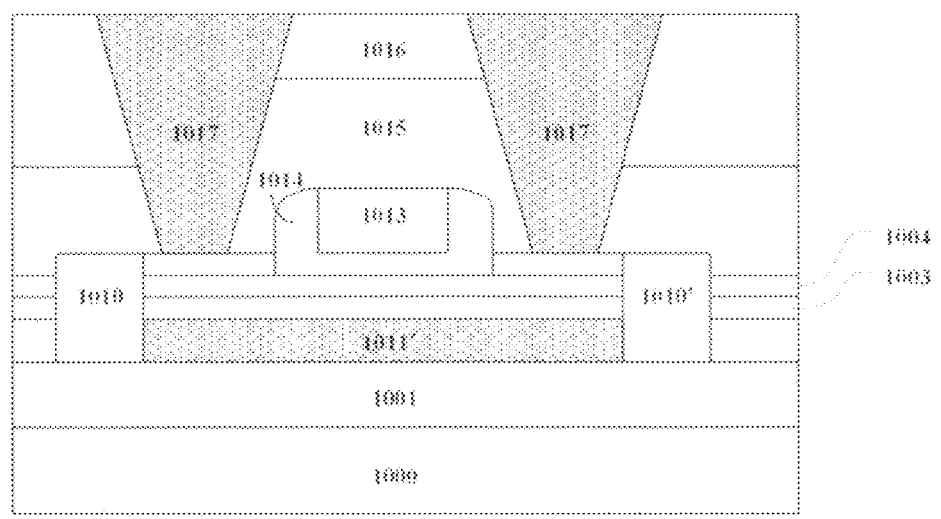
FIG. 11 is a cross sectional view illustrating that contact vias are formed in another embodiment of the method for manufacturing the semiconductor structure according to the present invention.

According to another embodiment of the present invention, a symmetric backgate 1011' is formed from the additional SOI layer by reducing the electrical resistance of the additional SOI layer, as shown in FIG. 11. Specifically, an SOI substrate is firstly provided; a shallow trench isolation is then formed; and ion implantation is performed on the additional SOI layer to form a portion of the additional SOI layer having a reduced electrical resistance, so as to form the backgate region. The materials and process parameters in the above steps may be those known by one skilled person in the art. Thus, no details are given here.

The semiconductor structure can adjust the threshold voltage by capacitive coupling between the backgate region and the source region or the drain region with common contacts, which leads to a simple manufacturing process, a higher integration level, and a lower manufacture cost. Moreover, the asymmetric design of the backgate structure can further enhance the effects of adjusting the threshold voltage and improve the performances of the device. Meanwhile, the doping type of the backgate region can be changed as required in an actual device design, so as to further improve the effects of adjusting the threshold voltage.

In the above description, no details are given for patterning and etching for various layers. Nevertheless, one skilled person will appreciate that the layers and regions having desired shapes can be formed by various approaches well known in the to field. Moreover, one skilled person may propose a process completely different from the above processes for providing the same structure.

While the invention has been described with reference to specific embodiments, the description is illustrative of the invention and is not to be considered as limiting the invention. The protection scope is defined by the attached claims and their equivalences. One skilled person will readily recognize that various modifications and changes may be made to the present invention without departing from the true scope of the present invention.

What is claimed is:

1. A semiconductor structure, comprising
    an SOI structure, comprising an SOI layer, a first buried insulating layer, an additional SOI layer, a second buried insulating layer, and a base substrate in this order from top to bottom;
    a shallow trench isolation embedded in the SOI structure and above the second buried insulation layer;
    a gate on the SOI structure;
    a source region and a drain region on opposite sides of the gate; and
    a source contact and a drain contact,
    wherein the additional SOI layer comprises an asymmetric backgate region and a laterally adjacent dielectric portion which are sandwiched between the first buried insulation layer and the second buried insulating layer, and the asymmetric backgate region is formed by doping a portion of the additional SOI layer that is formed in-situ within the additional SOI layer;
    wherein the backgate region comprises a portion of the additional SOI layer below either the source region or the drain region and a portion of the additional SOI layer below the gate; and
    wherein the other one of the source region or the drain region is over the adjacent dielectric portion.

2. The semiconductor structure according to claim 1, wherein a portion of the additional SOI layer below the other one of the source region and the drain region is an isolating dielectric region, which is adjacent to the backgate region.

3. The semiconductor structure according to claim 1, further comprising a raised source region and a raised drain region, which are on the source region and the drain region, respectively.

4. The semiconductor structure according to claim 1, wherein the first buried insulating layer and the second buried insulating layer are buried oxide layers.

5. A method for manufacturing a semiconductor structure, comprising:
    providing an SOI structure which comprises an SOI layer, a first buried insulating layer, an additional SOI layer, a second buried insulating layer, and a base substrate in this order from top to bottom;
    forming a shallow trench isolation embedded in the SOI structure and above the second buried insulation layer;
    forming an asymmetric backgate region by reducing the electrical resistance of a portion of the additional SOI layer;
    forming a gate on the SOI structure, and forming a source region and a drain region on opposite sides of the gate;
    wherein the additional SOI layer comprises the asymmetric backgate region and a laterally adjacent dielectric portion which are sandwiched between the first buried insulation layer and the second buried insulating layer, the asymmetric backgate region being formed by doping a portion of the additional SOI layer that is formed in-situ within the additional SOI layer, a portion of the additional SOI layer being below either the source region or the drain region and a portion of the additional SOI layer below the gate, and wherein the other one of the source region or the drain region is over the adjacent dielectric portion; and
    forming a source contact and a drain contact.

6. The method according to claim 5, wherein the step of forming the backgate region comprises performing n-type or p-type doping with a doping concentration of $10^{18}$~$10^{21}$ cm$^{-3}$.

7. The method according to claim 5, further comprising forming an isolating dielectric region in a portion of the additional SOI layer below the other one of the source region and the drain region, the isolating dielectric region being adjacent to the backgate region.

8. The method according to claim 7, wherein the step of forming the isolating dielectric region comprises
    performing n-type heavy doping in a portion of the additional SOI layer before formation of the shallow trench isolation;
    forming a shallow trench for isolation, so as to expose one side of the n-type heavily doped region;
    removing the n-type heavily doped region; and
    depositing an isolating dielectric.

9. The method according to claim 8, wherein the step of performing n-type heavy doping comprises performing As or P ion implantation.

10. The method according to claim 8, wherein the doping concentration is larger than $10^{18}$ cm$^{-3}$.

11. The method according to claim 5, further comprising forming a raised source region and a raised drain region on the source region and the drain region, respectively.

12. The method according to claim 5, wherein the first buried insulating layer and the second buried insulating layer are buried oxide layers.

* * * * *

UNITED STATES PATENT AND TRADEMARK OFFICE
CERTIFICATE OF CORRECTION

PATENT NO. : 9,178,070 B2  
APPLICATION NO. : 13/138053  
DATED : November 3, 2015  
INVENTOR(S) : Huilong Zhu et al.

Page 1 of 1

It is certified that error appears in the above-identified patent and that said Letters Patent is hereby corrected as shown below:

In the specification,

Col. 1, Line 30
  Delete "Is insulating"
  Insert -- insulating --

Col. 7, Line 29
  Delete "the to"
  Insert -- the --

Signed and Sealed this
Twenty-second Day of March, 2016

Michelle K. Lee
*Director of the United States Patent and Trademark Office*